United States Patent
Bertheau et al.

(10) Patent No.: US 6,345,236 B1
(45) Date of Patent: Feb. 5, 2002

(54) METHOD FOR DETECTING INSTALLATION AND/OR CALIBRATION ERRORS IN A PLURALITY OF SIGNAL OUTPUT UNITS OF ONE OR MORE PARTIAL-DISCHARGE MEASUREMENT SYSTEMS

(75) Inventors: Tom Bertheau, Waldshut (DE); Jörg Ruhe, Böttstein; Thomas Füglister, Brugg, both of (CH)

(73) Assignee: Asea Brown Boveri AG, Baden (CH)

( * ) Notice: Subject to any disclaimer, the term of this patent is extended or adjusted under 35 U.S.C. 154(b) by 0 days.

(21) Appl. No.: 09/350,885

(22) Filed: Jul. 12, 1999

(30) Foreign Application Priority Data

Jul. 18, 1998 (DE) .......................................... 198 32 387

(51) Int. Cl.[7] .......................... G01R 35/00; G06F 19/00
(52) U.S. Cl. ....................................... 702/107; 321/536
(58) Field of Search .................. 702/58, 107; 324/601, 324/536, 525

(56) References Cited

U.S. PATENT DOCUMENTS

| | | | | |
|---|---|---|---|---|
| 4,897,607 A | * | 1/1990 | Gruenwald | 324/512 |
| 5,323,117 A | * | 6/1994 | Endoh et al. | 324/551 |
| 5,446,682 A | | 8/1995 | Janke et al. | |
| 5,469,067 A | * | 11/1995 | Endoh et al. | 324/551 |
| 5,652,521 A | * | 7/1997 | Meyer | 324/551 |
| 5,682,100 A | * | 10/1997 | Rossie et al. | 324/535 |
| 5,903,158 A | * | 5/1999 | Eriksson et al. | 324/536 |
| 6,161,077 A | * | 12/2000 | Fawcett | 702/58 |

FOREIGN PATENT DOCUMENTS

| | | |
|---|---|---|
| DE | 36 35 611 A1 | 4/1988 |
| DE | 43 34 380 A1 | 4/1995 |
| DE | 19542535 A1 | 5/1997 |
| DE | 19647868 A1 | 5/1998 |

OTHER PUBLICATIONS

Germany Patent Office Search Report dated Apr. 15, 1999.
Laird, T.E., Periodic on–line partial discharge measurements on air and gas cooled generators of similar design, Sep. 1997, Electrical Insulation Conference, 1997, and Electrical Manufacturing and Coil Winding Conference. Proceedings, pp. 101–105.*
Wenzel, D., New Digital Calibrator with the impressed current pulses for discharge measurements, Sep. 1998, Electrical Insulating Materials, 1998, pp. 717–720.*
Geary, R., Towards Inproved calibration in the measurement of partial discharges in rotating machinery, Jun. 1990, Electrical Insulation, 1990, pp. 141–144.*
Ma Weiping, Research on on–line PD monitoring system for large power transformer, Sep. 1998, Electrical Insulating Materials, 1998, pp. 505–508.*

* cited by examiner

*Primary Examiner*—Marc S. Hoff
*Assistant Examiner*—Demetrius Pratlow
(74) *Attorney, Agent, or Firm*—Burns, Doane, Swecker & Mathis, L.L.P.

(57) ABSTRACT

A method for detecting installation and/or calibration errors in signal output units of a partial-discharge measurement system, where the signal output units are arranged at various points in an electrical insulation system, includes: Calibrating a selected one of the signal output units by injecting a first calibration pulse between a high-voltage side of the insulation system and ground. Storing calibration data obtained during the step of calibrating. Recording and storing a first set of partial discharge signals and an amplitude of the first calibration pulse via the selected signal output unit. Adopting the stored calibration data for the selected signal output unit, for calibrating the other signal output units. Recording and storing, via the other signal output units, a second set of partial discharge signals and an amplitude of a second calibration pulse. And, comparing the stored partial discharge signals for all the signal output units with one another.

6 Claims, 1 Drawing Sheet

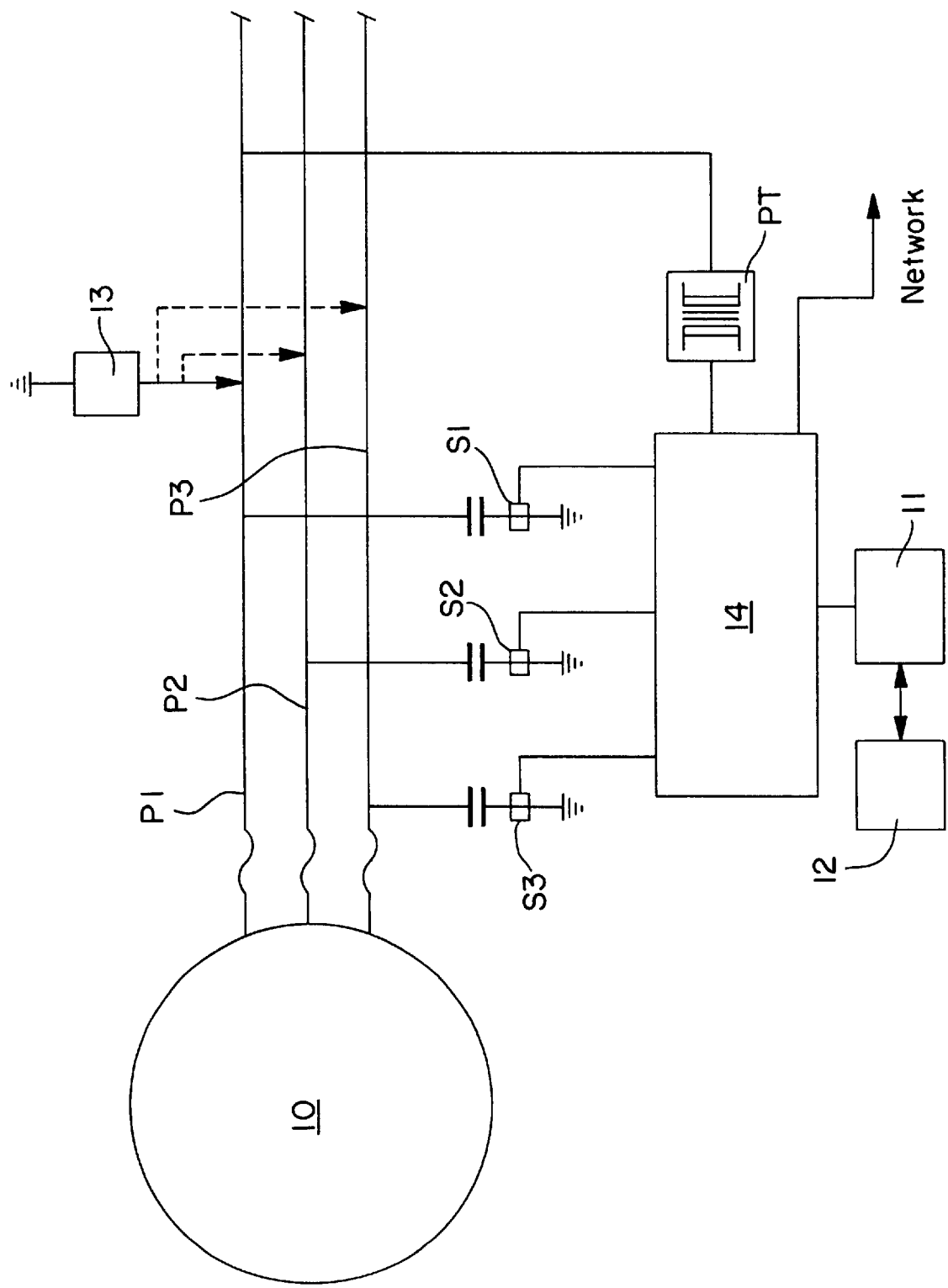

METHOD FOR DETECTING INSTALLATION AND/OR CALIBRATION ERRORS IN A PLURALITY OF SIGNAL OUTPUT UNITS OF ONE OR MORE PARTIAL-DISCHARGE MEASUREMENT SYSTEMS

BACKGROUND OF THE INVENTION

1. Field of the Invention

The present invention relates to the field of electrical insulation measurement technology. It refers to a method for detecting installation and/or calibration errors of a plurality of signal output units of one or more partial-discharge measurement systems, which signal output units are arranged at various points in an electrical insulation system, which is designed for high voltage, or in various insulation systems of the same type.

2. Discussion of Background

When checking the electrical insulation of high-voltage insulation systems, such as those for the stator winding of generators or for high-voltage transformers, it is often necessary—particularly in the case of multi-phase systems or a plurality of single-phase systems of the same type—to carry out partial-discharge measurements at various points in the system. For this purpose, signal output units are arranged at or fitted to the points to be measured, which units output appropriate partial-discharge signals and pass them on either to their own partial-discharge measurement system or—via a changeover switch—to a central partial-discharge measurement system. In order that the signals output from the individual signal output units can be compared with one another and can be sensibly correlated, it is necessary to produce identical measurement conditions at all the measurement points. This includes not only correct installation of the respective unit, but also a calibration which corresponds to and is compatible with the calibration of the other units.

SUMMARY OF THE INVENTION

Accordingly, one object of the invention is to provide a novel method by means of which it is possible to detect in a simple, reliable and safe manner whether there are any disturbing installation and calibration errors in the various signal output units.

A first preferred embodiment of the method according to the invention is distinguished in that the insulation system is a multi-phase system, and in that the individual signal output units are arranged on the various phases of the insulation system. A second preferred embodiment is distinguished in that the various insulation systems are single-phase insulation systems of an identical type, and in that the individual signal output units are each arranged in the various insulation systems.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein the single FIGURE shows an example of a measurement arrangement using which the method according to the invention can be carried out for a three-phase generator.

DESCRIPTION OF THE PREFERRED EMBODIMENTS

Referring now to the drawings, the FIGURE shows a calibration arrangement for a partial-discharge measurement system, using which it is possible to check the insulation of a high-voltage-insulated, three-phase generator 10. Internally, the generator 10 has a three-phase insulated winding, whose individual phases P1, ..., P3 are connected to the exterior and, for example, can be connected to a network (not illustrated). A (capacitive and/or inductive) signal output unit S1, ..., S3 is connected to each of the three phases, P1, ..., P3, using which unit partial-discharge signals can be output and can optionally be passed on, via an appropriate connecting device 14, to a central partial-discharge test set 11. The partial-discharge test set 11 is, for its part, connected to a data memory 12, in which results of the measurement and calibration can be stored. The data memory 12 may, of course, also be part of the partial-discharge test set 11 and/or of the connecting device 14.

In order to calibrate the signal output units S1, ..., S3, the partial-discharge test set 11 is synchronized to an appropriate calibration pulse. A synchronization device PT connected to the connecting device 14 is provided for synchronization in normal operation. The connecting device 14 is also connected to the normal network for synchronization of the system during calibration. A calibration pulse transmitter 13 is available for injection of a calibration pulse.

The signal output units S1, ..., S3 are now checked as follows: The generator 10 is disconnected from the network for the entire described procedure and, for safety reasons, is grounded during the changeover work and is then isolated from ground during the actual calibration processes. In a first step, a selected one of the signal output units S1, ..., S3, for example the signal output unit S1, is calibrated by injection of a calibration pulse, using the calibration pulse transmitter 13, between the high-voltage side of the signal output unit in a first phase (for example P1) and ground. The calibration data thus obtained are stored in the data memory 12. This chosen signal output unit (S1) is then used to record the partial discharge signals and/or the amplitude of the calibration pulse, which are likewise stored in the data memory 12.

In a further step, the stored calibration data for the selected signal output unit (S1) are adopted for calibration of the other signal output units (S2,S3), that is to say they are used to calibrate the other signal output units. With the other signal ouput units (S2,S3) calibrated in this way, the partial discharge signals and the amplitude of the calibration pulse (with the calibration pulse being fed to the respective phase) are then likewise recorded and stored in the data memory 12. Finally, the stored time-based or phase-based partial discharge signals and amplitudes of all the signal output units S1, ..., S3 are compared with one another manually or by means of a mathematical (quality) criterion. If they do not appear to be the same or the mathematical (quality) criterion is not satisfied, an installation and/or calibration error is present, which must then be corrected in order subsequently to obtain correct measurement results relating to the insulation of the system.

If, instead of a multi-phase insulation system, a plurality of single-phase insulation systems of the same type are tested, the steps described above are carried out for the signal output units in the various insulation systems.

Overall, the invention provides a particularly simple and effective method, using which installation and/or calibration errors can be detected in a partial-discharge measurement system having a plurality of signal output units. It is self-evident that a transformer, a motor or some other electrical device with high-voltage insulation may be used, instead of the generator considered in the example, as the measurement object of the partial-discharge measurement system.

Obviously, numerous modifications and variations of the present invention are possible in light of the above teachings. It is therefore to be understood that, within the scope of the appended claims, the invention may be practiced otherwise then as specifically described herein.

What is claimed as new and desired to be secured by Letters Patent of the United States is:

1. A method for detecting installation and/or calibration errors in a plurality of signal output units of one or more partial-discharge measurement systems, wherein the signal output units are arranged at various points in an electrical insulation system, the method comprising the steps of:

a) calibrating a selected one of the plurality of signal output units by injecting a first calibration pulse between a high-voltage side of the insulation system and ground;

b) storing calibration data obtained during the step of calibrating;

c) Recording a first set of partial discharge signals and an amplitude of the first calibration pulse via the selected signal output unit and storing the first set of partial discharge signals and the amplitude of the first calibration pulse;

d) adopting the stored calibration data for the selected signal output unit, for the calibration of the other signal output units;

e) Recording a second set of partial discharge signals and an amplitude of a second calibration pulse via the other ones of the plurality of signal output units and storing the second set of partial discharge data signals and the amplitude of the second calibration pulse; and f) comparing the stored partial discharge signals for all the signal output units with one another.

2. The method as claimed in claim 1, wherein the insulation system is a multi-phase system, and wherein the individual ones of the plurality of signal output units are arranged on the various phases of the multi-phase system.

3. The method as claimed in claim 1, wherein the insulation system comprises a plurality of single-phase insulation systems of an identical type, and wherein individual ones of the plurality of signal output units are provided for each of the plurality of single-phase insulation systems.

4. The method as claimed in claim 2, wherein the insulation system comprises a rotating electrical machine.

5. The method of claim 4, wherein the rotating electrical machine is a generator.

6. The method of claim 1, wherein the electrical insulation system is designed for high voltage.

* * * * *